United States Patent
Droegeler et al.

(10) Patent No.: US 11,885,474 B2
(45) Date of Patent: Jan. 30, 2024

(54) LED MODULE WITH SEPARATE HEAT SINK AND REFERENCING PART, HEADLIGHT, AND METHOD OF MANUFACTURE

(71) Applicant: LUMILEDS LLC, San Jose, CA (US)

(72) Inventors: Marc Droegeler, Aachen (DE); Wim Boogaard, Oostkapelle (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/955,328

(22) Filed: Sep. 28, 2022

(65) Prior Publication Data
US 2023/0099650 A1 Mar. 30, 2023

Related U.S. Application Data

(60) Provisional application No. 63/249,215, filed on Sep. 28, 2021.

(51) Int. Cl.
*F21S 45/47* (2018.01)
*F21S 41/141* (2018.01)

(52) U.S. Cl.
CPC ............ *F21S 45/47* (2018.01); *F21S 41/141* (2018.01)

(58) Field of Classification Search
CPC .......... F21S 45/47; F21S 45/49; F21S 41/141; F21S 41/39; F21Y 2115/10; F21V 29/15
See application file for complete search history.

(56) References Cited

U.S. PATENT DOCUMENTS

| 5,660,461 | A | * | 8/1997 | Ignatius | ................... F21V 29/76 362/249.02 |
| 6,274,924 | B1 | | 8/2001 | Carey et al. | |
| 2005/0180157 | A1 | | 8/2005 | Watanabe et al. | |
| 2009/0189178 | A1 | | 7/2009 | Kim et al. | |
| 2014/0293631 | A1 | | 10/2014 | Lee | |
| 2018/0283647 | A1 | * | 10/2018 | Hemon | ................. F21V 29/503 |

FOREIGN PATENT DOCUMENTS

| JP | 2007-258619 A | 10/2007 |
| JP | 2007-311760 A | 11/2007 |

OTHER PUBLICATIONS

International Search Report and Written Opinion for PCT International Application No. PCT/US2022/045094 dated Jan. 13, 2023.

* cited by examiner

*Primary Examiner* — Robert J May
(74) *Attorney, Agent, or Firm* — Volpe Koenig

(57) ABSTRACT

An LED module is described herein. The LED module includes a heatsink with an LED mounting area and a referencing part that is separate from the heatsink. The referencing part is fixed to the heatsink and includes an LED alignment feature and an optical component alignment feature. At least one LED is provided on the LED mounting area of the heatsink and aligned with the LED alignment feature of the referencing part.

18 Claims, 6 Drawing Sheets

LED MODULE WITH SEPARATE HEAT SINK AND REFERENCING PART, HEADLIGHT, AND METHOD OF MANUFACTURE

CROSS REFERENCE TO RELATED APPLICATIONS

This application claims the benefit of U.S. Provisional Patent Application No. 63/249,215, which was filed on Sep. 28, 2021, the contents of which are hereby incorporated by reference herein.

BACKGROUND

Light emitting diodes (LEDs), which may include any or all semiconductor light emitting devices including, for example, diode lasers, more and more replace older technology light sources due to superior technical properties, such as energy efficiency and lifetime. This is true as much for demanding applications (e.g., vehicle headlighting) as it is for less demanding applications, for example in terms of luminance, luminosity, and/or beam shaping. However, despite their energy efficiency, LEDs, and in particular high power ones, may still develop considerable heat requiring cooling, which is conventionally done by connecting the LED to a heatsink to keep LED junction temperatures low. This need for heat sinking LEDs is shared with many other high-power semiconductor components.

SUMMARY

An LED module is described herein. The LED module includes a heatsink with an LED mounting area and a referencing part that is separate from the heatsink. The referencing part is fixed to the heatsink and includes an LED alignment feature and an optical component alignment feature. At least one LED is provided on the LED mounting area of the heatsink and aligned with the LED alignment feature of the referencing part.

BRIEF DESCRIPTION OF THE DRAWINGS

A more detailed understanding can be had from the following description, given by way of example in conjunction with the accompanying drawings wherein.

DETAILED DESCRIPTION

Figure 1A:
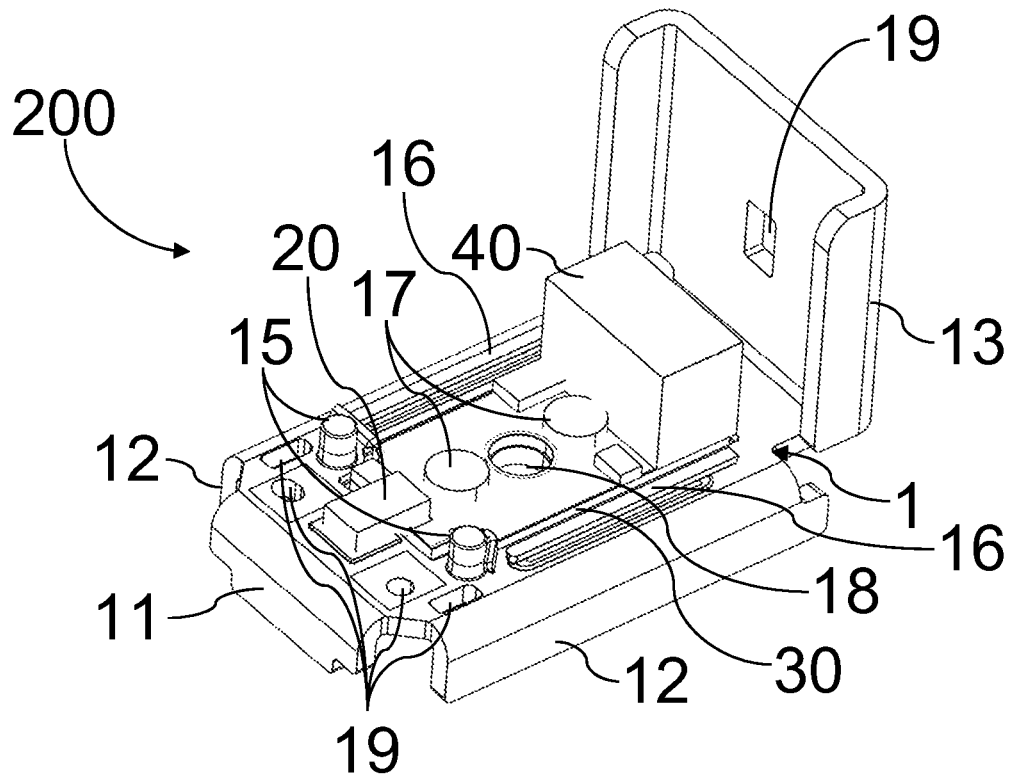
FIG. 1A and FIG. 1B are schematic perspective views of an example LED module.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Heatsinks for LED modules may fulfil several functions and, at the same time, may have to obey various constraints. Firstly, a heatsink has to provide for the thermal management of the LED module when in operation. In other words, the heatsink has to spread the heat input by the operating LED into the part of the heatsink where the LED is mounted (also referred to as the LED mounting area herein) to the other parts of the heatsink where the heat finally has to be transferred to the heatsink's environment.

The heat transfer to the environment may be performed by heat conduction, convection (which may be enhanced by forced convection using, for example, a fan), and/or radiative heat transfer. All these processes strongly depend on the size of the heatsink's surface area. Thus, conventionally, heatsinks for high lumen LED modules may get quite bulky and may very well determine to a large degree the space occupied by the LED module. For the LED module to fit into a limited installation space of a luminaire, often the heatsinks need to be custom made for the specific luminaire. This is especially true for LED modules for vehicle headlights requiring large lumen packages.

For vehicle headlights, however, and also for other applications requiring beam shaping, the LEDs of the LED module need to be aligned to the optical component(s) processing the light emitted by the LEDs in operation. In that, the alignment to the first optical component directly receiving the light emitted by the LEDs, which may be a reflector close to the LEDs, may be particularly sensitive, for example for avoiding glare outside the desired beam profile. Therefore, the LED module may include alignment features for such first optical component and for the LEDs, and the placement of such alignment features and of the LEDs with respect to such alignment features has to be performed with high precision.

The bulkiness of the heatsinks for LED modules together with the requirement to fit them in a limited installation space leads to a multitude of complex three-dimensional heatsink shapes specific for each luminaire type. The limited numbers of heatsinks required for each such shape prevents mass manufacturing and, thus, increases manufacturing cost. This may even be aggravated by incorporating the alignment features in the heatsink (which is done when the LEDs, for optimal thermal management, are placed on the heatsink), requiring the heatsink to be manufactured with high precision. Furthermore, the LED modules with the bulky heatsinks may occupy relatively large volumes and are relatively heavy, causing shipping costs to be very expensive as well.

Figure 1B:
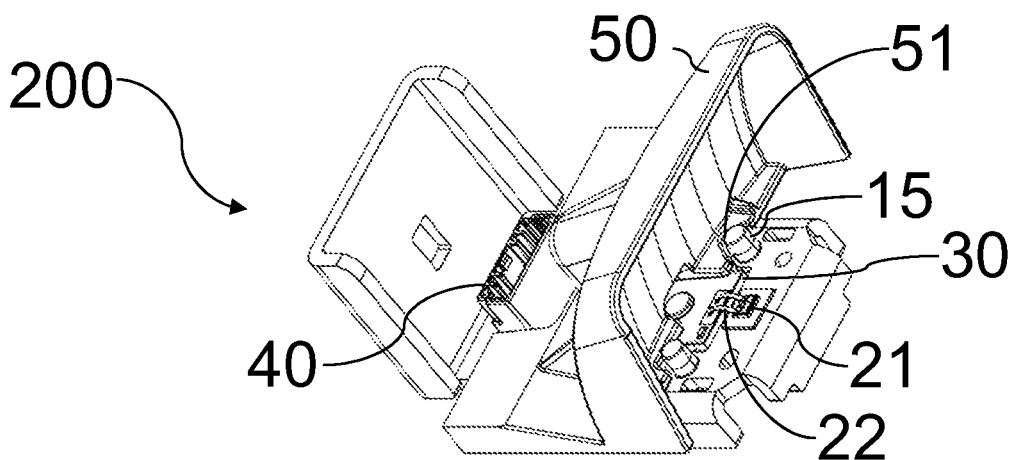

FIG. 1A and FIG. 1B are schematic perspective views of an example LED module. More specifically, FIG. 1A shows the complex shape of heatsink 1 with front, side, and rear wings 11, 12, and 13, alignment features 15, 16, fixation features 17, and mounting features 19. An LED block 20 (schematically illustrated only) may be mounted on heatsink 1 and electrically connected to printed circuit board (PCB) 30, which itself may be mounted to heatsink 1 by fixation features 17 (e.g., rivets). PCB 30 may carry electrical connector 40 (schematically illustrated only). Mounting features 19 of heatsink 1 are shown as cutouts and may be used for mounting further components to the heatsink, such as a light shield for blocking undesired stray light of the LED module 200. Through-hole 18 in heatsink 1 and PCB 30 may serve for fixing an optical component 50, which may be a reflector (see FIG. 1B) to heatsink 1, such as by a screw or rivet penetrating through-hole 18. The reflector may be aligned by touching alignment features 15, 16 of heatsink 1.

FIG. 1B shows how carve-outs 51 of reflector 50 may enclose alignment features 15 of heatsink 1 (e.g., cylindrical pins upright protruding from the heatsink's plane (the plane of PCB 30)) for alignment within such plane. Transversal to such plane, alignment may be performed by reflector 50 touching the alignment features 16 of heatsink 1 (e.g., planar stripes slightly elevated from the heatsink's plane (not visible in FIG. 1B). FIG. 1B, showing the LED module 200 of FIG. 1A, with reflector 50 added, in an about 90° rotated view, shows more detail of electrical connector 40 for electrical connection to the environment of LED module 200 and of LED block 10 with LEDs 21 being electrically connected by ribbon bonds 22 to PCB 30.

The heatsink 1 may have the issues described above. While such heatsink 1 may already be slimmer and lighter than alternative die casted heatsinks, the wings 11, 12, 13 give the heatsink a complex, bulky, and relatively heavy 3D shape. Alignment features 15, 16 have to be made with high precision. While prior art heatsink 1 may fit in some luminaires, others may require modifications, such as different extensions or angles to the heatsink plane of wings 11, 12, and in particular of the rear wing 13. This may compromise economy of scale with mass manufacturing of such heatsinks, which, because of incorporating the alignment features, may need to be done with high precision.

Figure 2:
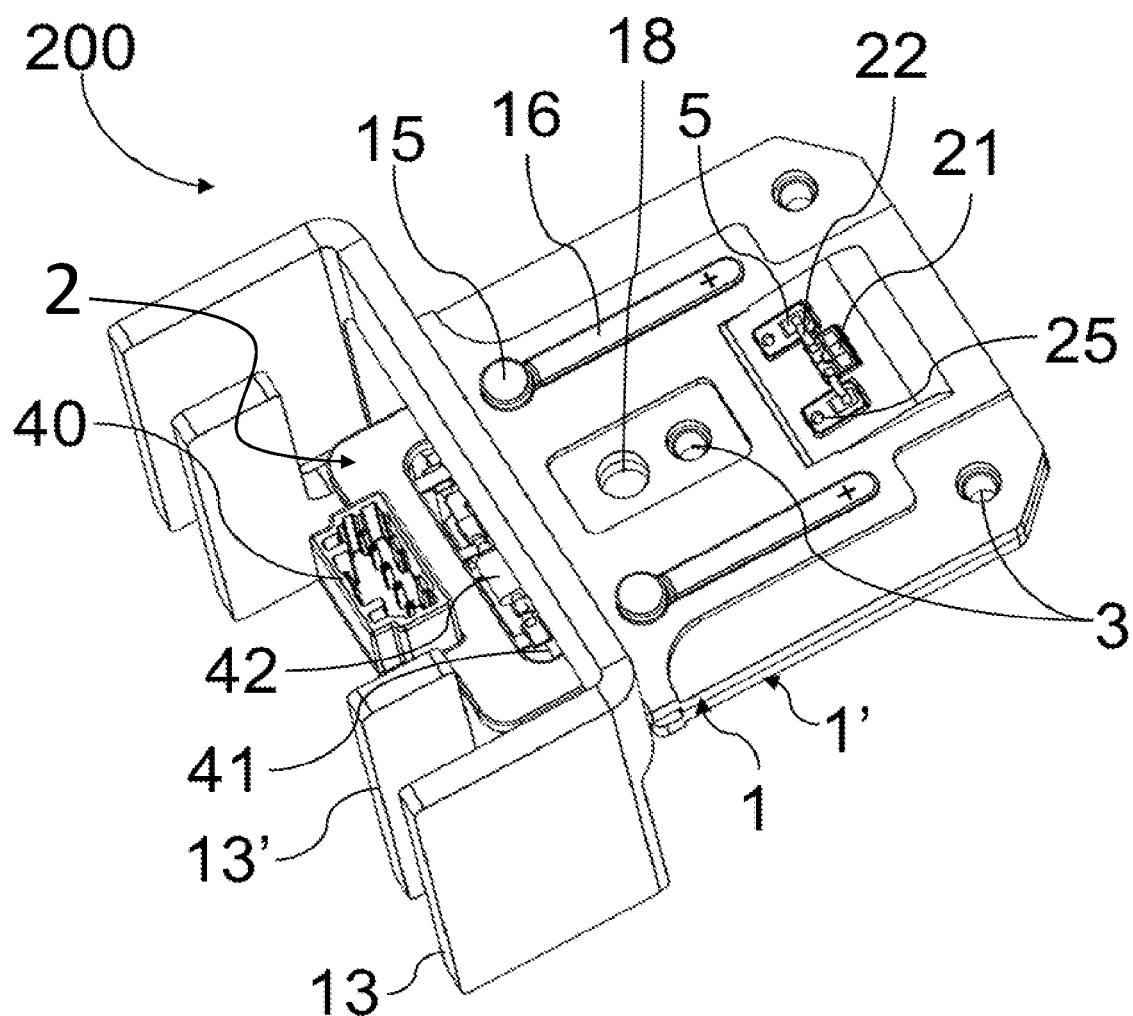
FIG. 2 is a schematic perspective view another example LED module.

FIG. 2 is a schematic perspective view another example LED module 200. Visible, similar to FIG. 1A and FIG. 1B, are the connector 40, the optical component alignment features 15, 16 for the reflector, the through-hole 18 (for reflector fixation, three LEDs 21, and the ribbon bonds 22.

Instead of a single heatsink 1, a further heatsink 1' may be used in addition wherein the rear wings 13, 13' of the heatsinks 1, 1' may intertwine with each other. Furthermore, shown are electrical traces or lines 41, further electrical components 42 (e.g., a Transition Voltage Suppression (TVS) diode), contact pads 5 for receiving the ribbon bonds 22 connecting the LEDs 21, bores 3 for screws or rivets fixing the heatsinks 1, 1' to each other, and LED alignment features 25 (fiducial marks) for referencing placement of the LEDs 21.

As compared to the LED module 200 of FIG. 1A and FIG. 1B, alignment features 15, 16, 25 are not part of any of the heatsinks 1, 1' but are, instead, part of a referencing part 2 of the LED module 200. This can be seen in FIG. 3 where, for visibility, the heatsinks 1, 1' have been separated from the referencing part 2 in exploded view. Besides the high precision alignment features 15, 16, 25, the reference part 2 may also include electrical circuitry, such as the contact pads 5, the connector 40, the electrical traces 41, and the further electrical components 41.

The referencing part 2 may be sandwiched between the heatsinks 1, 1'. The lower heatsink 1', for example, may have a cavity 2' receiving, in fitting manner, the referencing part 2. The lower heatsink 1' may further have an elevation 4 engaging, in a fitting manner, a cutout 4' in the referencing part 2. The upper heatsink 1 may have mirror symmetric parts to the lower heatsink 1' or may just be flat to rest on the lower heatsink 1', the two heatsinks 1, 1' sandwiching and fixing the referencing part 2, depending on the implementation.

Figure 3:
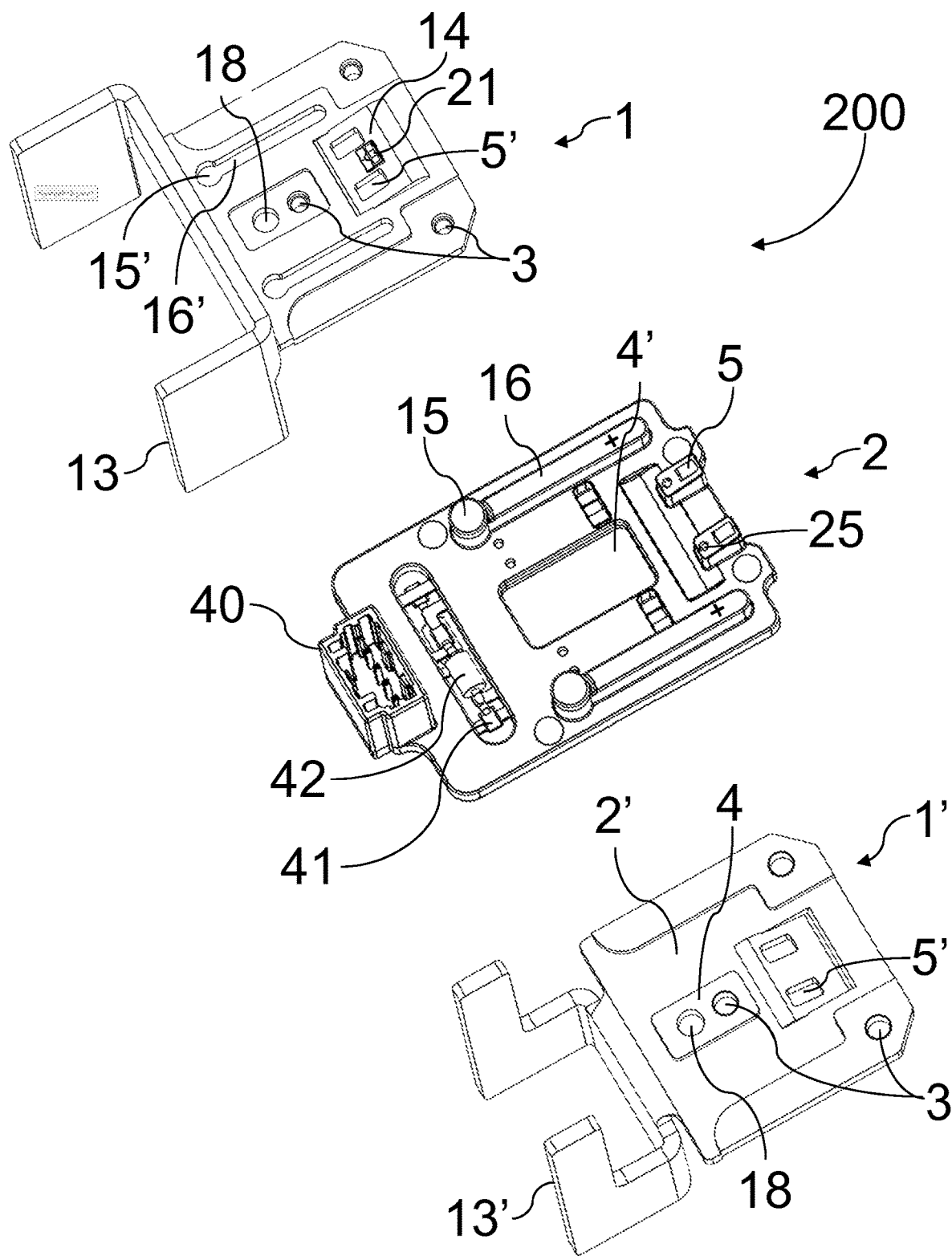
FIG. 3 is a schematic perspective exploded view of the example LED module of FIG. 2.

The heatsinks 1, 1' may have cutouts 5' penetrated, after assembly, by the elevated contact pads 5 of the referencing part 2 such that the contact pads 5 may be accessible from the outer surfaces of heatsinks 1, 1'. FIG. 2 and FIG. 3 3 show a dual-function LED module 200. In such embodiments, besides the LEDs 21 that are visible in the figures and mounted on mounting area 14 of the upper heatsink 1, there may also be LEDs 21 on the lower surface of lower heatsink 1' not visible in the figures. These lower LEDs 21 may be contacted via (in the figures not visible) contact pads 5 on the lower side of referencing part 2 penetrating the cutouts 5' of lower heatsink 1'. The alignment features 15, 16, 25 on referencing part 2 may penetrate, after assembly, the cutouts 15', 16' in upper heatsink 1 and, thus, may become accessible for aligning an optical component 50 and referencing mounting of the LEDs 21 on the LED mounting area 14 of upper heatsink 1 (cf. for the placement of the optical component 50 FIG. 1B).

The LEDs 21 on the LED mounting area 14 of upper heatsink 1, after assembly in the vehicle together with the optical component 50 and, possibly, further optical components in the vehicle headlight, may realize a first function of the dual-function LED module 200, such as a low beam. In a similar way, the LEDs 21 on the lower surface of lower heatsink 1', after assembly in the vehicle together with another optical component attached to the LED module 200 on its lower side and, possibly, further optical components in the vehicle headlight, may realize a second function of the dual-function LED module 200, such as a high beam.

While the dual-function LED module 200 of FIG. 2 and FIG. 3 show a two-part heatsink made up of upper and lower heatsinks 1, 1', a dual-function LED module 200 may as well be realized with a single heatsink. For example, the LEDs 21 for the first function may be mounted to the upper surface of the single heatsink, and the LEDs 21 for the second function may be mounted on the lower surface of the single heatsink. In such embodiments, the single heatsink may need to be adjusted to ensure that the necessary cutouts 5' for the contact pads 5 of the referencing part 2 are included to allow electrical contacting of the LEDs 21 on the upper and lower surfaces of the single heatsink. Additionally, two separate optical components attached to the LED module 200 on the upper and lower surfaces of the two heatsinks 1, 1' or of the single heatsink may not be required. In such embodiments, the LED module 200 may, for example, be directly placed in front of a single reflector as a single optical component common to the two functions of the LED module 200.

Moving the alignment features 15, 16, 25 from the heatsinks 1, 1' to a separate referencing part 2 may leave only the referencing part 2 as a high-precision component while the heatsinks 1, 1' can be more coarsely manufactured. This is possible as the fixation between referencing part 2 and heatsinks 1, 1' can be tight without requiring high precision at the heatsinks 1, 1'. Such might, for example, be done by clamping the referencing part 2 between the heatsinks 1, 1', exerting the clamping force at a part of referencing part 2 uncritical to the clamping force, or using a resilient material at the clamping areas. The LEDs 21 may be mounted in the mounting areas 14 of heatsinks 1, 1' after referencing part 2 and heatsinks 1, 1' have been tightly fixed to each other. Thus, such mounting of LEDs 21 can be performed in reference to the LED alignment features 25 on referencing part 2. In the same manner, for example after fixing referencing part 2 to heatsinks 1, 1', the optical component 50 (cf. FIG. 1) may be mounted in reference to the optical component alignment features 15, 16. Thus, no high precision may be required for heatsinks 1, 1'.

With the bulky heatsinks 1, 1' no longer requiring high precision, their manufacture can be substantially simplified, and, thus, manufacturing cost can be reduced. Additionally, the manufacture of the high-precision referencing part 2 and of the bulky heatsinks 1, 1' can be separated to different factories. Even more important, the referencing part 2, just being a component requiring fixation to a heatsink, can be kept quite simple and universal in shape. Thus, a single shape of referencing part 2 may be usable in many different luminaires while the heatsinks 1, 1' may be adapted to each particular luminaire shape. This may enable a considerable economy of scale in mass manufacturing the referencing parts 2 while custom making the heatsinks 1, 1'. The referencing parts being relatively small and, thus, light weight components, shipping cost may be minor, allowing a centralized mass manufacturing in a few or even a single factory while making the heatsinks 1, 1' local for local.

By such, a building block system for referencing parts 2 and heatsinks 1, 1' may be possible. For example, a series or collection of different referencing part shapes may be combined with a series or collection of heatsink shapes by standardizing the fixation between referencing parts and heatsink(s). Such fixation may be performed by any suitable method, such as mechanically (e.g. by screwing, riveting, or crimping, with or without an intervening thermal grease for improving heat transfer if the referencing part carries heat generating electrical components). Such connection, however, may also be performed by gluing or heat staking, with the latter being particularly suitable when the referencing part is made of a heat deformable material, such as plastics. Additionally or alternatively, the referencing part may also be molded to the heatsink.

The referencing part 2 may only need to comprise the alignment features 15, 16, 25 for optical component and LED referencing. All other features shown in FIGS. 2 and 3, could be moved to other components of the LED module 200, such as to a separate PCB (cf. PCB 30 of FIG. 1A and FIG. 1B) or onto the heatsinks 1, 1'. However, advantage may be taken by including at least some of these components with the referencing part 2. For example, including the contact pads 5 and the electrical traces 41 within the referencing part 2 may further centralize functionality benefitting standardized manufacturing. This may be continued by including further electrical components 42, such as TVS diodes, LED bin resistors, or even driver components for the LEDs 21. The connector 40 may also be made one-piece with the referencing part 2 if desirable.

The referencing part 2 may be mainly made out of plastics and fabricated, for example, by insert molding. The electrical traces 41 may be formed as strips of a lead frame, then over-molded by plastics, the lead frame ends and the plastics, for example, also forming the connector 40. Alternatively, electrical connections and components and also an electrical connector may be placed on a PCB and joined as a component to the referencing part 2. Alternatively, the electrical traces may be formed, for example, by printing on a surface of the plastics of the referencing part 2. However, the referencing part 2 can be made by any suitable method, such as by assembling separate components in a housing.

As shown in FIGS. 2 and 3, a plate-like shape of the referencing part 2 may be advantageous, in particular for sandwiching between two heatsinks 1, 1'. This may hold as well if using only a single heatsink 1, such as if such heatsink 1 itself is plate like. However, by molding, more complex shapes can be easily realized for the referencing part, which could be adapted to the shape of the heatsink it is to be attached to.

Figure 4:
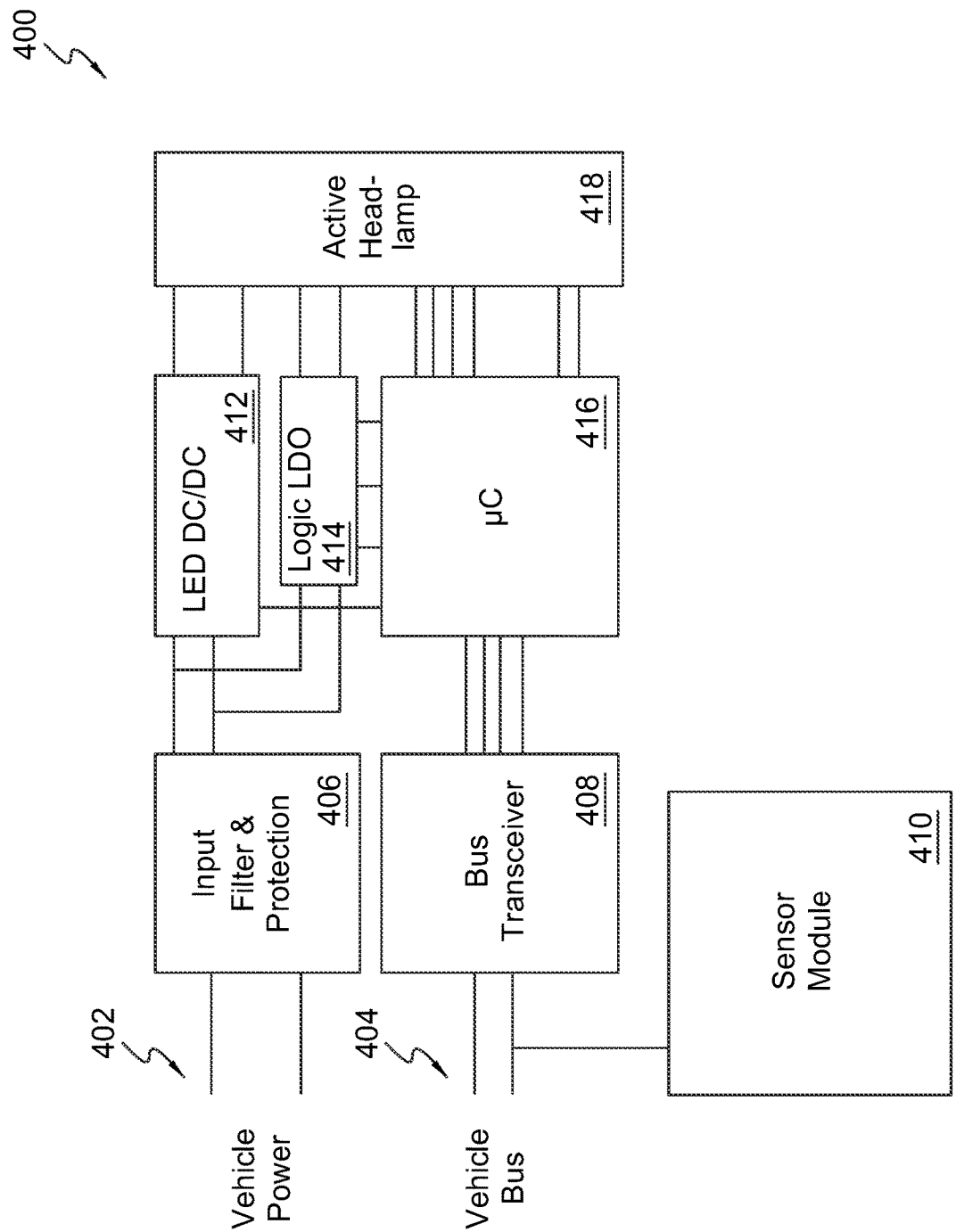
FIG. 4 is a diagram of an example vehicle headlamp system.

FIG. 4 is a diagram of an example vehicle headlamp system 400 that may incorporate one or more of the embodiments and examples described herein. The example vehicle headlamp system 400 illustrated in FIG. 4 includes power lines 402, a data bus 404, an input filter and protection module 406, a bus transceiver 408, a sensor module 410, an LED direct current to direct current (DC/DC) module 412, a logic low-dropout (LDO) module 414, a micro-controller 416 and an active head lamp 418.

The power lines 402 may have inputs that receive power from a vehicle, and the data bus 404 may have inputs/outputs over which data may be exchanged between the vehicle and the vehicle headlamp system 400. For example, the vehicle headlamp system 400 may receive instructions from other locations in the vehicle, such as instructions to turn on turn signaling or turn on headlamps, and may send feedback to other locations in the vehicle if desired. The sensor module 410 may be communicatively coupled to the data bus 404 and may provide additional data to the vehicle headlamp system 400 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 400. In FIG. 4, the headlamp controller may be a micro-controller, such as micro-controller (pc) 416. The micro-controller 416 may be communicatively coupled to the data bus 404.

The input filter and protection module 406 may be electrically coupled to the power lines 402 and may, for example, support various filters to reduce conducted emissions and provide power immunity. Additionally, the input filter and protection module 406 may provide electrostatic discharge (ESD) protection, load-dump protection, alternator field decay protection, and/or reverse polarity protection.

The LED DC/DC module 412 may be coupled between the input filter and protection module 406 and the active headlamp 418 to receive filtered power and provide a drive current to power LEDs in the LED array in the active headlamp 418. The LED DC/DC module 412 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 414 may be coupled to the input filter and protection module 406 to receive the filtered power. The logic LDO module 414 may also be coupled to the micro-controller 416 and the active headlamp 418 to provide power to the micro-controller 416 and/or electronics in the active headlamp 418, such as CMOS logic.

The bus transceiver 408 may have, for example, a universal asynchronous receiver transmitter (UART) or serial peripheral interface (SPI) interface and may be coupled to the micro-controller 416. The micro-controller 416 may translate vehicle input based on, or including, data from the sensor module 410. The translated vehicle input may include a video signal that is transferrable to an image buffer in the active headlamp 418. In addition, the micro-controller 416 may load default image frames and test for open/short pixels during startup. In embodiments, an SPI interface may load an image buffer in CMOS. Image frames may be full frame, differential or partial frames. Other features of micro-controller 416 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 5:
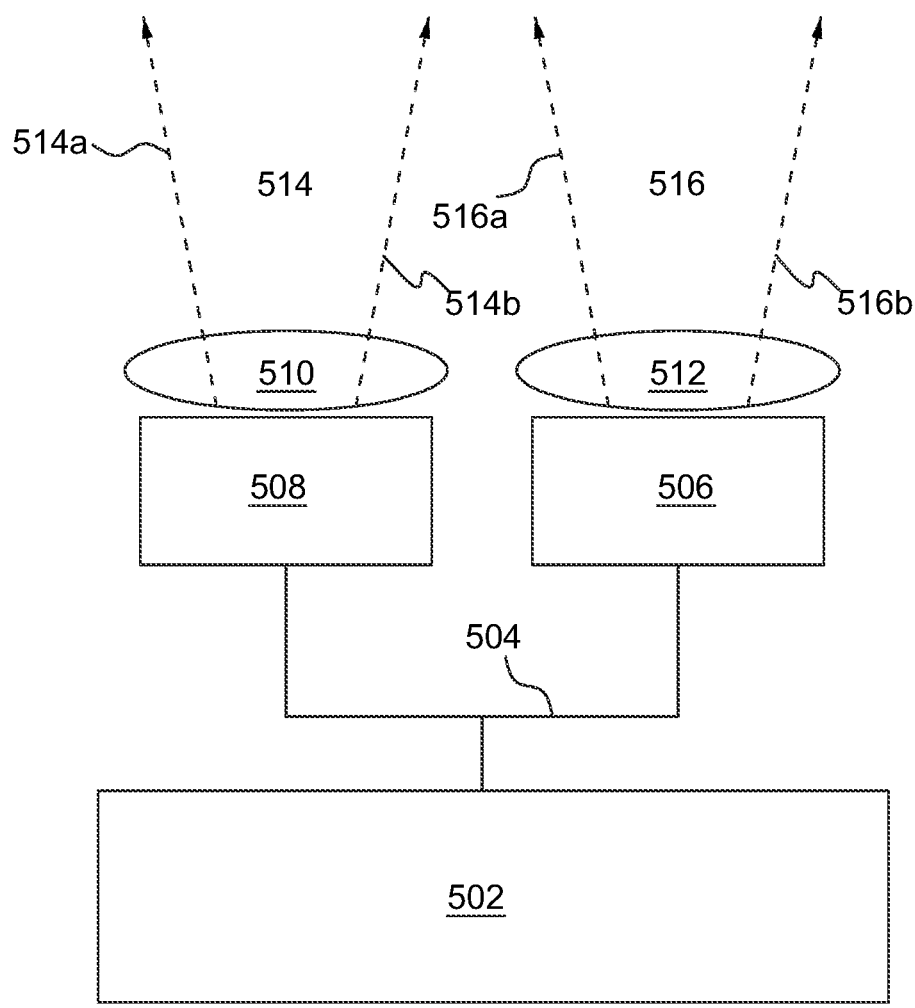
FIG. 5 is a diagram of another example vehicle headlamp system.

FIG. 5 is a diagram of another example vehicle headlamp system 500. The example vehicle headlamp system 500 illustrated in FIG. 5 includes an application platform 502, two LED lighting systems 506 and 508, and secondary optics 510 and 512.

The LED lighting system 508 may emit light beams 514 (shown between arrows 514a and 514b in FIG. 5). The LED lighting system 506 may emit light beams 516 (shown between arrows 516a and 516b in FIG. 5). In the embodiment shown in FIG. 5, a secondary optic 510 is adjacent the LED lighting system 508, and the light emitted from the LED lighting system 508 passes through the secondary optic 510. Similarly, a secondary optic 512 is adjacent the LED lighting system 506, and the light emitted from the LED lighting system 506 passes through the secondary optic 512. In alternative embodiments, no secondary optics 810/812 are provided in the vehicle headlamp system.

Where included, the secondary optics 510/512 may be or include one or more light guides. The one or more light guides may be edge lit or may have an interior opening that defines an interior edge of the light guide. LED lighting systems 508 and 506 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 508 and 506 in a desired manner, such as, for example, with a gradient, a chamfered distribution, a narrow distribution, a wide distribution, or an angular distribution.

The application platform 502 may provide power and/or data to the LED lighting systems 506 and/or 508 via lines 504, which may include one or more or a portion of the power lines 402 and the data bus 404 of FIG. 4. One or more sensors (which may be the sensors in the vehicle headlamp system 500 or other additional sensors) may be internal or external to the housing of the application platform 502. Alternatively, or in addition, as shown in the example vehicle headlamp system 400 of FIG. 4, each LED lighting system 508 and 506 may include its own sensor module, connectivity and control module, power module, and/or LED array.

Figure 6:
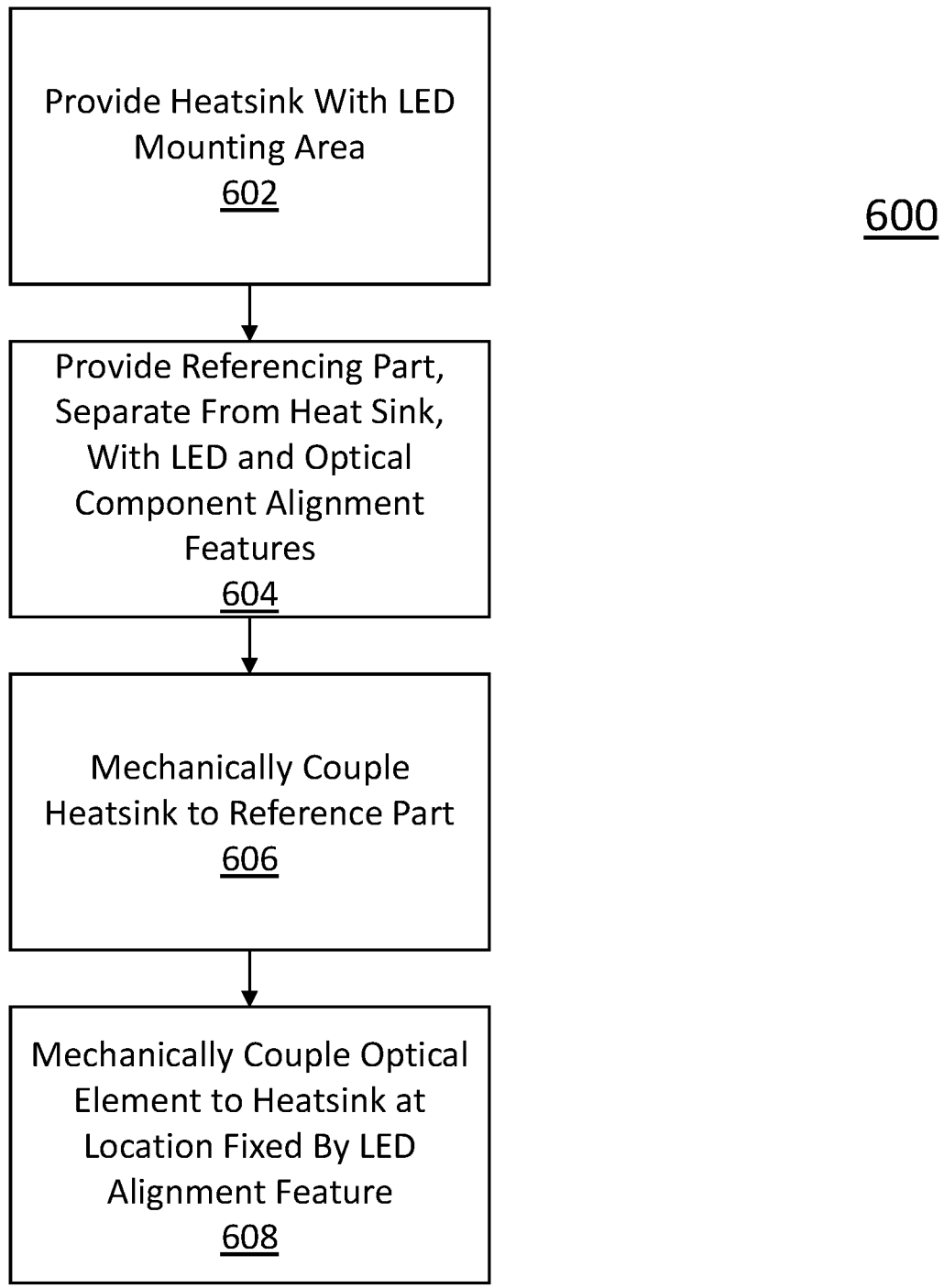
FIG. 6 is a flow diagram of an example method of manufacturing an LED module.

FIG. 6 is a flow diagram 600 of an example method of manufacturing an LED module. In the example illustrated in FIG. 6, the method includes providing a heatsink comprising an LED mounting area (602) and providing a referencing part, separate from the heatsink (604). The referencing part may include an LED alignment feature and an optical component alignment feature. The heatsink may be mechanically coupled to the referencing part (606). An optical element may be mechanically coupled to the heatsink at a location fixed by the LED alignment feature of the referencing part (608).

In some embodiments, the mechanical coupling the heatsink to the referencing part may include at least one of screwing, riveting, crimping, gluing or and molding the heatsink to the referencing part. The referencing part may be selected from a collection of different referencing part, and the heatsink may similarly be selected from a collection of different referencing parts. In some embodiments, the reference part may be formed by overmolding a leadframe to form at least the LED alignment feature and the optical component alignment feature. In some embodiments, a second or other heatsink may be provided, and the referencing part may be clamped between the two heatsinks to mechanically couple them together.

As would be apparent to one skilled in the relevant art, based on the description herein, embodiments of the present invention can be designed in software using a hardware description language (HDL) such as, for example, Verilog or VHDL. The HDL-design can model the behavior of an electronic system, where the design can be synthesized and ultimately fabricated into a hardware device. In addition, the HDL-design can be stored in a computer product and loaded into a computer system prior to hardware manufacture.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting diode (LED) module comprising:
    a heatsink comprising an LED mounting area;
    a referencing part, separate from the heatsink, fixed to the heatsink, and comprising an LED alignment feature, an optical component alignment feature, and electrical traces connectable to the at least one LED; and
    at least one LED on the LED mounting area of the heatsink and aligned with the LED alignment feature of the referencing part.

2. The LED module according to claim 1, further comprising an optical component, mounted to the heatsink, and aligned with the optical component alignment feature.

3. The LED module according to claim 1, wherein the heatsink further comprises mounting features configured for mounting further components to the LED module.

4. The LED module according to claim 1, further comprising an other heatsink, wherein the reference part is fixed between the heatsink and the other heatsink.

5. The LED module according to claim 1, further comprising at least one other LED on the other LED mounting area, the at least one LED being configured for a first lighting function of the LED module, and the at least one other LED being configured for a second lighting function of the LED module.

6. The LED module according to claim 1, wherein the reference part is one of a lead frame or a printed circuit board (PCB) comprising the electrical traces.

7. The LED module according to claim 1, wherein the reference part further comprises one or more of an electrical connector and further electrical components electrically coupled to the electrical traces.

8. The LED module according to claim 1, wherein the referencing part is plate like.

9. The LED module according to claim 1, wherein the referencing part is a molded plastics part.

10. The LED module according to claim 9 wherein the referencing part further comprises, on the molded plastics part, electrical traces connectable to the LED of the LED module.

11. A vehicle headlight comprising:
   an LED module comprising:
      a heatsink comprising an LED mounting area,
      a referencing part, separate from the heatsink, fixed to the heatsink, and comprising an LED alignment feature, an optical component alignment feature, and electrical traces connectable to the at least one LED, and
      at least one LED on the LED mounting area of the heatsink and aligned with the LED alignment feature of the referencing part; and
      an optical element, mounted to the heatsink, and aligned with the optical component alignment feature.

12. The vehicle headlight of claim 11, wherein the optical element is a reflector.

13. A method of manufacturing an LED module, the method comprising:
   providing a heatsink comprising an LED mounting area;
   providing a referencing part, separate from the heatsink, and comprising an LED alignment feature, an optical component alignment feature, and electrical traces connectable to the at least one LED;
   mechanically coupling the heatsink to the referencing part; and
   mechanically coupling an optical element to the heatsink at a location fixed by the LED alignment feature of the referencing part.

14. The method of claim 13, wherein the mechanically coupling the heatsink to the referencing part comprises at least one of screwing, riveting, crimping, gluing or and molding the heatsink to the referencing part.

15. The method of claim 13, wherein the providing the referencing part comprises selecting the referencing part from a collection of different referencing parts.

16. The method of claim 13, wherein the providing the heatsink comprises selecting the heat sink from a collection of different heatsinks.

17. The method of claim 13, wherein the providing the referencing part comprises overmolding a leadframe to form at least the LED alignment feature and the optical component alignment feature.

18. The method of claim 13, further comprising providing an other heatsink, wherein the mechanically coupling the heatsink to the referencing part further comprises clamping the referencing part between the heatsink and the other heatsink.

* * * * *